(12) United States Patent
Guo et al.

(10) Patent No.: US 10,642,114 B2
(45) Date of Patent: May 5, 2020

(54) DISPLAY PANEL AND DISPLAY DEVICE

(71) Applicants: HEFEI BOE OPTOELECTRONICS TECHNOLOGY CO., LTD., Hefei, Anhui (CN); BOE TECHNOLOGY GROUP CO., LTD., Beijing (CN)

(72) Inventors: Yuanhui Guo, Beijing (CN); Bo Liu, Beijing (CN); Yuqi Liu, Beijing (CN)

(73) Assignees: HEFEI BOE OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/328,924

(22) PCT Filed: Feb. 9, 2018

(86) PCT No.: PCT/CN2018/076038
§ 371 (c)(1),
(2) Date: Feb. 27, 2019

(87) PCT Pub. No.: WO2019/007066
PCT Pub. Date: Jan. 10, 2019

(65) Prior Publication Data
US 2019/0196280 A1    Jun. 27, 2019

(30) Foreign Application Priority Data

Jul. 3, 2017    (CN) .......................... 2017 1 0535298

(51) Int. Cl.
*G02F 1/1362*    (2006.01)
*G02F 1/1368*    (2006.01)
(Continued)

(52) U.S. Cl.
CPC ...... *G02F 1/136204* (2013.01); *G02F 1/1368* (2013.01); *G02F 1/13318* (2013.01);
(Continued)

(58) Field of Classification Search
CPC ...................... G02F 1/136204; G02F 1/13318
See application file for complete search history.

(56) References Cited

U.S. PATENT DOCUMENTS 5,652,632 A  *  7/1997  Shimizu ............ G02F 1/136204
                                                    349/40
5,760,855 A  *  6/1998  Nakase ............. G02F 1/136204
                                                    349/149
(Continued)

FOREIGN PATENT DOCUMENTS

CN        103926739 A     7/2014
CN       20140096635 A    8/2014
(Continued)

OTHER PUBLICATIONS

International Search Report and English Translation of Box V of the Written Opinion dated May 10, 2018, received for corresponding PCT Application No. PCT/CN2018/076038.

*Primary Examiner* — James A Dudek
(74) *Attorney, Agent, or Firm* — Kinney & Lange, P.A.

(57) ABSTRACT

A display panel and a display device are provided. The display panel includes: a first electrostatic discharge layer comprising a first electrode portion and a second electrode portion disconnected from each other, the first electrode portion being located in a display area of the display panel, and the second electrode portion being located in a peripheral area of the display panel; a second electrostatic discharge layer separated from the first electrostatic discharge layer in a thickness direction of the display panel; a first electrical connection member configured to electrically connect the second electrostatic discharge layer with the second electrode portion of the first electrostatic discharge layer; and a switching device configured to turn on or off an electrical connection between the first electrode portion and the second electrode portion.

16 Claims, 6 Drawing Sheets

(51) Int. Cl.
     *G02F 1/1335*     (2006.01)
     *G02F 1/1345*     (2006.01)
     *G02F 1/133*     (2006.01)
     *G09G 3/36*     (2006.01)
     *G02F 1/1333*     (2006.01)

(52) U.S. Cl.
     CPC .... *G02F 1/13458* (2013.01); *G02F 1/133512* (2013.01); *G09G 3/36* (2013.01); *G02F 1/1345* (2013.01); *G02F 2001/13312* (2013.01); *G02F 2001/133397* (2013.01); *G02F 2201/121* (2013.01); *G02F 2201/50* (2013.01); *G02F 2202/22* (2013.01)

(56) References Cited

U.S. PATENT DOCUMENTS

| | | |
|---|---|---|
| 2018/0046024 A1 | 2/2018 | Li et al. |
| 2018/0188571 A1 | 7/2018 | Wang |
| 2018/0246369 A1 | 8/2018 | Huang |

FOREIGN PATENT DOCUMENTS

| | | |
|---|---|---|
| CN | 105652545 A | 6/2016 |
| CN | 105786244 A | 7/2016 |
| CN | 105954919 A | 9/2016 |
| CN | 206162002 U | 5/2017 |

\* cited by examiner

DISPLAY PANEL AND DISPLAY DEVICE

CROSS-REFERENCE TO RELATED APPLICATION

This application is a Section 371 National Stage Application of International Application No. PCT/CN2018/076038, filed on Feb. 9, 2018, which claims priority to Chinese Patent Application No. 201710535298.x filed on Jul. 3, 2017 in the State Intellectual Property Office of China, the disclosure of which is hereby incorporated by reference in its entirety.

TECHNICAL FIELD

The present disclosure relates to the field of display technologies, and in particular, to a display panel and a display device.

BACKGROUND

In a display panel, the prevention of static electricity is very important. If the static electricity in an environment (hereinafter referred to as external static electricity) enters the inside of the panel, the panel may display abnormally. Not only the external static electricity, but also static electricity generated by ion accumulation or the like due to electric field changes inside the panel (hereinafter referred to as internal static electricity) may cause abnormal display on the panel. Therefore, in the design of the display panel, it is necessary to consider how to effectively eliminate the adverse effects of external and/or internal static electricity on the display panel.

SUMMARY

One of the objects of the present disclosure is to provide a display panel and a display device.

An embodiment of an aspect of the present disclosure provides a display panel comprising: a first electrostatic discharge layer comprising a first electrode portion and a second electrode portion disconnected from each other, the first electrode portion being located at least in a display area of the display panel, and the second electrode portion being located in a peripheral area of the display panel; a second electrostatic discharge layer separated from the first electrostatic discharge layer in a thickness direction of the display panel; a first electrical connection member configured to electrically connect the second electrostatic discharge layer with the second electrode portion of the first electrostatic discharge layer; and a switching device configured to turn on or off an electrical connection between the first electrode portion and the second electrode portion.

According to an embodiment of the present disclosure, the switching device is a TFT, and one of a source electrode and a drain electrode of the TFT is electrically connected to the first electrode portion, the other one of the source electrode and the drain electrode of the TFT is electrically connected to the second electrode portion, and a gate electrode of the TFT is used for receiving a trigger signal.

According to an embodiment of the present disclosure, the display panel further comprises a first substrate and a second substrate opposite to each other, the first electrostatic discharge layer is disposed on a side of the first substrate facing the second substrate, and the second electrostatic discharge layer is disposed on a side of the second substrate facing the first substrate.

According to an embodiment of the present disclosure, the switching device is a thermistor, the thermistor is connected between the first electrode portion and the second electrode portion, and a resistance of the thermistor decreases with increasing temperature.

According to an embodiment of the present disclosure, the first electrostatic discharge layer comprises a common electrode and the second static electrostatic discharge layer comprises a black matrix.

According to an embodiment of the present disclosure, the switching device is a photoresistor, the photoresistor is connected between the first electrode portion and the second electrode portion, and a resistance of the photoresistor decreases with increasing light intensity.

According to an embodiment of the present disclosure, material of the first electrical connection member comprises conductive silver paste.

According to an embodiment of the present disclosure, the display panel further comprising: a surface conductive layer covering at least one outer surface of the display panel; a ground wire, separated from the surface conductive layer in the thickness direction of the display panel; and a second electrical connection member configured to electrically connect the surface conductive layer to the ground wire.

According to an embodiment of the present disclosure, the display panel further comprises a first substrate and a second substrate opposite to each other, the ground wire is disposed on a side of the first substrate facing the second substrate, and the surface conductive layer is disposed on a side of the second substrate away from the first substrate.

According to an embodiment of the present disclosure, the second electrical connection member is electrically isolated from the second electrostatic discharge layer, and the first electrical connection member is electrically isolated from the surface conductive layer.

According to an embodiment of the present disclosure, the display panel further comprises a liquid crystal layer, the liquid crystal layer being located between the first electrostatic discharge layer and the second electrostatic discharge layer.

According to an embodiment of the present disclosure, the first electrical connection member and/or the second electrical connection member are formed in the peripheral area of the display panel.

According to an embodiment of the present disclosure, wherein the second electrostatic discharge layer comprises a first portion at least in the display area of the display panel and a second portion in the peripheral area of the display panel, the first portion is electrically isolated from the second portion, and the second electrical connection member is electrically connected to the second portion.

According to an embodiment of the present disclosure, the first electrostatic discharge layer comprises a common electrode, and the ground wire and the common electrode are disposed in the same layer.

According to an embodiment of the present disclosure, the number of at least one of the first electrical connection member and the second electrical connection member is one or more.

An embodiment of another aspect of the present disclosure provides a display device comprising the display panel as described in the embodiments of the above aspect.

DETAILED DESCRIPTION OF THE EMBODIMENTS

Figure 1A:
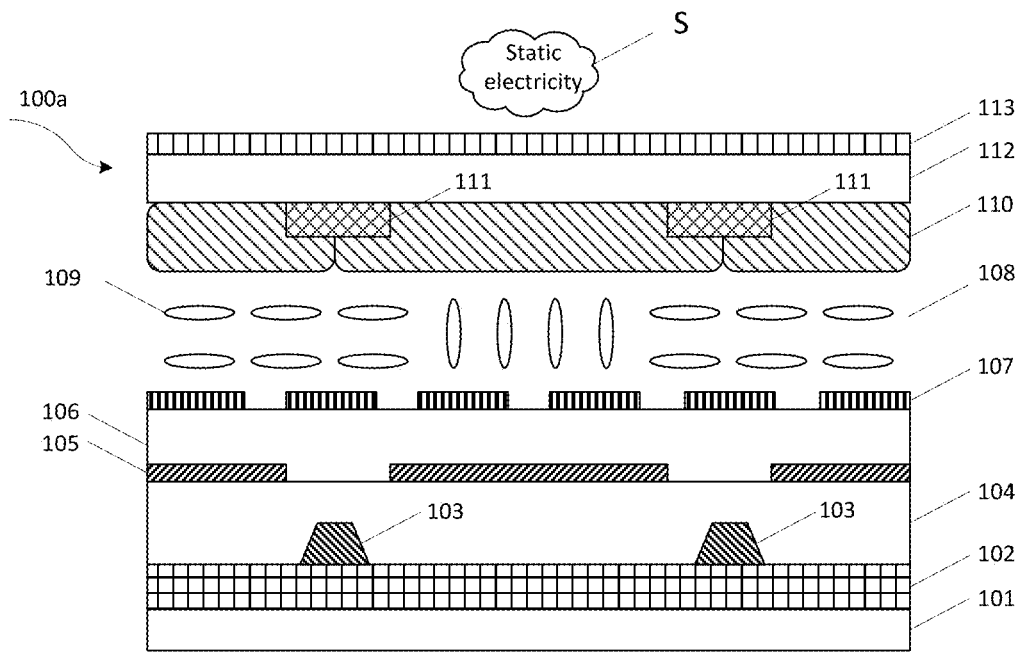
FIG. 1A illustrates a schematic cross-sectional view of an exemplary display panel which is affected by external static electricity.

In order to explain the purpose, technical solutions and advantages of the present disclosure more clearly, the embodiments of the present disclosure will be described in detail below with reference to the accompanying drawings. It is apparent that the described embodiments are parts of the embodiments of the present disclosure, and not all of them. It is to be understood that the following description of the embodiments is intended to explain and illustrate a general concept of the present disclosure and is not construed as limiting the disclosure. In the specification and the drawings, the same or similar reference numerals refer to the same or similar components or components. For the sake of clarity, the drawings are not necessarily to scale.

Unless otherwise defined, technical terms or scientific terms used in the present disclosure are intended to be understood in the ordinary sense of those of ordinary skill in the art to which the disclosure pertains. The words "first," "second," and similar terms used in the present disclosure do not denote any order, quantity, or importance, but are used to distinguish different components. The words "including" or "comprising", and the like, are intended to mean that the elements or items that appear before the words include the elements or items listed after the words and their equivalents, and do not exclude other elements or items. The words "connecting" or "connected" and the like are not limited to physical or mechanical connections, but may include electrical connections, whether direct or indirect. The words "upper", "lower", "left", "right", "top" or "bottom" and the like are merely used to indicate relative positional relationship. When the absolute position of the object to be described is changed, the relative positional relationship may be correspondingly changed. When an element such as a layer, a film, a region or a substrate is referred to as being "on" or "under" another element, the element may be "directly" or there may be intermediate components.

FIG. 1A shows a schematic cross-sectional view of an exemplary display panel 100a which is affected by external static electricity. As shown in FIG. 1, the display panel 100a includes: a lower substrate 101, a first insulating layer 102 on the lower substrate 101, a data line 103 on the first insulating layer 102, a second insulating layer 104 covering the data line 103, a pixel electrode 105 on the second insulating layer 104, a third insulating layer 106 covering the pixel electrode 105, a common electrode 107 on the third insulating layer 106, a liquid crystal layer 108 on the common electrode 107, liquid crystal molecules 109 in the liquid crystal layer 108, a color filter layer 110 above the liquid crystal layer 108, a black matrix 111 between sub-pixels of the color filter layer 110, an upper substrate 112 above the black matrix 111, and a conductive layer 113 on a surface of the upper substrate 112.

As shown in FIG. 1A, when static electricity S is generated on a surface of the display panel, under the influence of static electricity, a part of the liquid crystal molecules 109 corresponding to a position, where static electricity is generated, inside the display panel may be abnormally deflected, resulting in abnormal display on a screen.

Figure 1B:
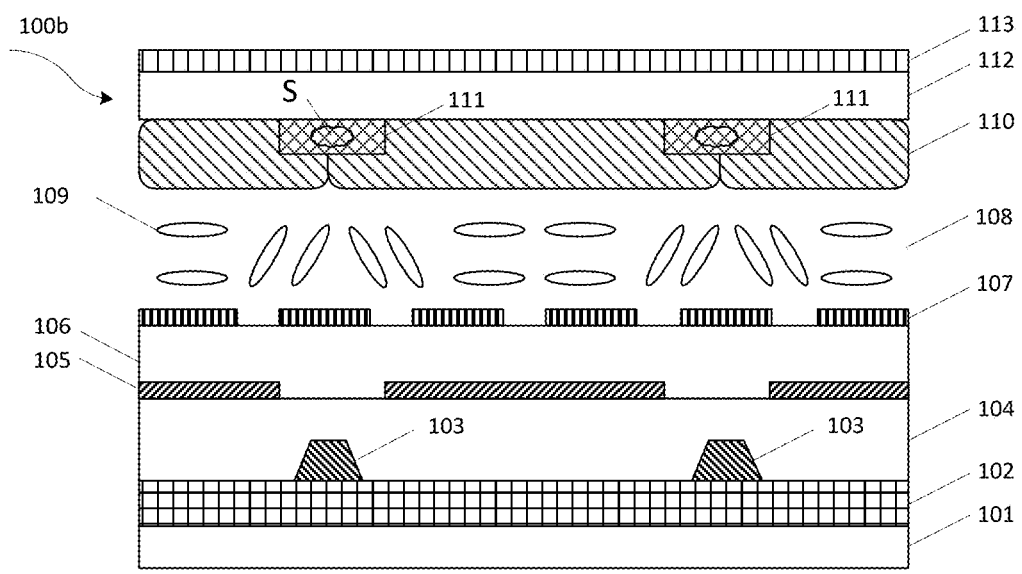
FIG. 1B illustrates a schematic cross-sectional view of another exemplary display panel which is affected by internal static electricity.

On the other hand, FIG. 1B shows a schematic cross-sectional view of another exemplary display panel 100b which is affected by internal static electricity, the display panel 100b has the same structure as the display panel shown in FIG. 1A. Inside the screen, ions are accumulated on the black matrix due to electric field changes or the like so that internal static electricity S is formed. As shown in FIG. 1B, since ion accumulation occurs in the black matrix 111, an electric field (due to internal static electricity S) is generated between the black matrix 111 and the common electrode 107, causing a part of liquid crystal molecules 109 to be abnormally deflected, thereby resulting in abnormal display on the screen.

When the display panel displays the same image for a long time or works in a high-temperature/high-light environment, the static electricity has a large influence, which may cause serious afterimage/flicker, and even cause related signal lines to burn, resulting in serious consequences.

In view of the above problems, some embodiments of the present disclosure provide a display panel including a first electrostatic discharge layer and a second electrostatic discharge layer disposed apart from the first electrostatic discharge layer in a thickness direction of the display panel. A first electrical connection member is disposed between the first electrostatic discharge layer and the second electrostatic discharge layer, and the first electrical connection member is capable of electrically connecting the first electrostatic discharge layer and the second electrostatic discharge layer. According to a structure of the display panel described above, the first electrostatic discharge layer and the second electrostatic discharge layer are electrically connected with each other by the first electrical connection member, so that the first electrostatic discharge layer has the same potential as the second electrostatic discharge layer, and ion concentration on the black matrix may be eliminated, thereby preventing adverse effects of internal static electricity on the display panel. In an exemplary embodiment, the first electrostatic discharge layer includes a common electrode and the second electrostatic discharge layer includes a black matrix.

FIG. 1B is exemplified by accumulating charges on the black matrix in the display panel, but the present disclosure is not limited thereto, and the problem of accumulating charges on other second electrostatic discharge layers may also be solved. Similarly, the other second electrostatic discharge layers may be electrically connected to other first electrostatic discharge layers like the common electrode by other first electrical connection members, so that the other second electrostatic discharge layers have the same potential as the other first electrostatic discharge layers, and ion concentration on the other second electrostatic discharge layers may be eliminated, thereby preventing adverse effects of internal static electricity on the display panel.

A further embodiment of the present disclosure provide a display panel including a surface conductive layer covering at least one outer surface of the display panel and a ground wire disposed apart from the surface conductive layer in the thickness direction of the display panel. A second electrical connection member is disposed between the surface conductive layer and the ground wire, and the second electrical connection member electrically connects the surface conductive layer to the ground wire. According to the structure of the display panel described above, the second electrical connection member electrically connects the surface conductive layer to the ground wire to discharge external static electricity accumulated on the surface of the display panel, thereby preventing adverse effects of external static electricity on the display panel.

The material of the first electrical connection member and the second electrical connection member may be conductive silver paste. The two electrical connection members are made of conductive silver paste, so that the process is simple and is easy to implement, and the production efficiency is improved.

According to some other embodiments of the present disclosure, the switching device may be provided to be in cooperation with the first electrical connection member, such that the black matrix is selectively electrically connected to the common electrode. Therefore, it is convenient for the user to selectively turn on or off the anti-static function according to the use environment. For example, when the external ambient temperature is high, or when the ambient light intensity is strong, or when the display panel displays the same image for a long time, the anti-static function may be turned on by the switching device to prevention accumulation on the black matrix and prevent the display panel from malfunctioning. In other embodiments, the switching device may be an integral portion of the first electrical connection member.

According to a further embodiment, another switching device may also be provided to be in cooperation with the second electrical connection member, such that the surface conductive layer is selectively grounded as needed to discharge static electricity accumulated on the surface of the display panel. In other embodiments, the another switching device may also serve as an integral portion of the second electrical connection member.

According to a specific embodiment, the common electrode in the display panel includes a first electrode portion and a second electrode portion that are disconnected from each other, the first electrode portion is located at least in a display area of the display panel, and the second electrode portion is located in a peripheral area of the display panel. The first electrical connection member may be made of conductive silver paste and configured to electrically connect the black matrix to the second electrode portion, and the switching device is configured to turn on or off an electrical connection between the first electrode portion and the second electrode portion.

According to the display panel of the embodiment, the black matrix is selectively electrically connected to a portion of the common electrode in the display area by the disconnected common electrode and the switching device, so that the internal anti-static function may be selectively turned on or off to prevent adverse effects of internal static electricity on the display panel. Meanwhile, the black matrix is electrically connected to the second electrode portion located in the peripheral area of the display panel by the first electrical connection member made of conductive silver paste, so that the process is simple and is easy to implement, and the conductive silver paste is prevented from affecting the display area.

According to a specific embodiment, the switching device may be a thin film transistor (abbreviated as TFT) element, one of a source electrode and a drain electrode of the TFT is electrically connected to the first electrode portion, and the other of the source electrode and the drain electrode of the TFT is the electrically connected to second electrode portion, and a gate electrode of the TFT is used to receive a trigger signal. Since the TFT serves as the switching device, the switching device for connecting the two portions of the common electrode may be fabricated in the process of fabricating the TFT of the array substrate, so that the switching device may be easily manufactured, and the process may be saved.

According to a further embodiment, the switching device may be a thermistor connected between the first electrode portion and the second electrode portion, and the resistance of the thermistor decreases with increasing temperature. With the thermistor, the first electrode portion may be electrically connected with the second electrode portion when the ambient temperature is higher than a certain temperature to turn on the internal anti-static function. Two electrode portions respectively connected with the first electrode portion and the second electrode portion at both ends of the thermistor may be formed in synchronization with the source electrode and drain electrode of the TFT of the array substrate, and a heat sensitive material layer located between the two electrode portions of the thermistor may be formed by a separate mask process.

According to a further embodiment, the switching device may be a photoresistor connected between the first electrode portion and the second electrode portion, and the resistance of the photoresistor decreases with increasing light intensity. The first photoresist portion may be electrically connected with the second electrode portion when the ambient light intensity is stronger than a certain light intensity to turn on the internal anti-static function. Two electrode portions respectively connected with the first electrode portion and the second electrode portion at both ends of the photoresistor may be formed in synchronization with the source electrode and drain electrode of the TFT of the array substrate, and a photosensitive material layer located between the two electrode portions of the photoresistor may be formed by a separate mask process.

According to some embodiments of the present disclosure, the second electrical connection member may be electrically isolated from the black matrix. In this way, it is possible to prevent external static electricity from entering the black matrix inside the display panel through the second electrical connection member, and to prevent a potential difference from being generated between the black matrix and the common electrode.

Similarly, according to some embodiments of the present disclosure, the first electrical connection member may be electrically isolated from the surface conductive layer such that the first electrical connection member may be prevented from grounding through the surface conductive layer and there is no potential difference between the black matrix and the common electrode.

The display panel in an embodiment of the present disclosure may be a display panel having only one substrate, or may be a display panel having two substrates opposite to each other.

Embodiments of the present disclosure may be applied to a liquid crystal display panel in which a liquid crystal layer is provided between a black matrix and a common electrode. Embodiments of the present disclosure may also be applied to other display panels that need to prevent electrostatic effects.

According to an embodiment of the present disclosure, the first electrical connection member and/or the second electrical connection member may be formed in the peripheral area of the display panel. In this way, it is possible to prevent the electrical connection members from affecting the normal display of the display area of the display panel.

An embodiment of another aspect of the present disclosure provides a display device including the above display panel.

In addition, when the switching device employs a TFT, according to an embodiment, the display device may further include a sensing device, the sensing device may generate a trigger signal for triggering the turning-on and off of the TFT. For example, the sensing device may be a temperature sensor to trigger the TFT according to a predetermined temperature condition to turn on the anti-static function; or the sensing device may be a light sensor to trigger the TFT according to a predetermined illumination condition to turning on the anti-static function; or, the sensing device may be an image sensor to trigger the TFT according to a state of the displayed image, for example, when the display panel displays the same image in a predetermined period, the TFT will be triggered to turn on the anti-static function.

According to the above embodiment, the display device may further include a processor, the processor receives the trigger signal from the sensing device, and transmits a control signal to a driving integrated circuit (abbreviated as IC) of the display panel according to the trigger signal, so that turning-on and off of the TFTs are controlled by the driving IC.

It will be understood by those skilled in the art that, according to other embodiments, the sensing device may also be directly connected to the gate of the TFT without the processor and the driver IC, and trigger the TFT to be turned on according to a predetermined condition. For example, the sensing device may be a thermistor connected to the gate electrode of the TFT, and when the predetermined temperature is reached, the thermistor triggers the TFT to be turned on. Alternatively, the sensing device may be a photoresistor connected to the gate electrode of the TFT, and when the predetermined light intensity is reached, the photoresistor triggers the TFT to be turned on. Alternatively, the sensing device may be an image sensor connected to the gate electrode of the TFT, and when it is detected that the display panel displays the same image for a predetermined period, the image sensor triggers the TFT to be turned on. The sensing device may be disposed in a circuit inside the display panel or in a circuit external to the display panel as required.

The specific structure of the display panel according to an embodiment of the present disclosure will be described below with reference to the accompanying drawings.

Figure 2:
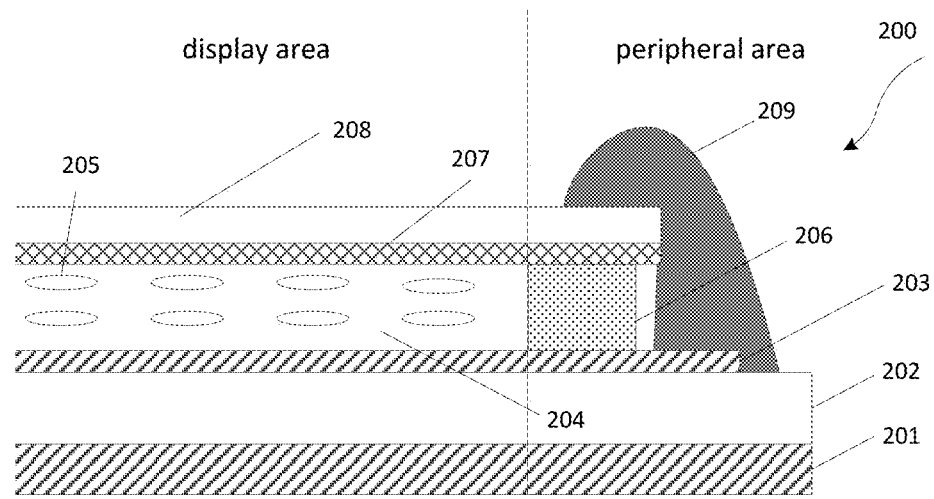
FIG. 2 illustrates a partial structural view of a display panel according to an exemplary embodiment of the present disclosure.

FIG. 2 illustrates a partial structural view of a display panel 200 according to an exemplary embodiment of the present disclosure. As shown in FIG. 2, the display panel 200 includes: a first substrate (hereinafter referred to as a lower substrate) 201, an insulating layer 202 over the lower substrate 201, a common electrode 203 on the insulating layer 202, a liquid crystal layer on the common electrode 203, liquid crystal molecules 205 in the liquid crystal layer 204, a sealant 206 around the liquid crystal layer 204, a black matrix 207 above the liquid crystal layer 204, and a second substrate (hereinafter referred to as an upper substrate) 208 above the black matrix 207. The display panel 200 further includes a first electrical connection member 209 made of conductive silver paste for electrically connecting the black matrix 207 to the common electrode 203.

According to the structure of the display panel of this embodiment, the black matrix and the common electrode are electrically connected by the first electrical connection member so that they have the same potential. Even if ions are accumulated in the black matrix of the display panel during operation of the display panel (for example, due to high ambient temperature, strong illumination, or display panel displaying the same image for a long time), no electric field will be generated between the black matrix and the common electrode, so that the liquid crystal molecules will not normally deflected, and thus the display panel may still work normally.

Those skilled in the art will appreciate that the first electrical connection member made of conductive silver paste is only one example. Other electrical connection members, such as gold wires or the like, may be instead of the first electrical connection member made of conductive silver paste to electrically connect the black matrix to the common electrode. Although FIG. 2 shows that the first electrical connection member 209 made of conductive silver paste is physically connected among the upper substrate 208, the black matrix 207, and the common electrode 203, to facilitate applying the conductive silver paste after the upper substrate is assembled, and then curing the conductive silver paste to form the first electrical connection member 209. However, it should be understood that the conductive silver paste may be applied only between the black matrix and the common electrode without being disposed on the upper substrate.

In addition, in order to clearly illustrate the inventive concept of the present disclosure, FIG. 2 only schematically shows a partial structure of the display panel 200, and other structures of the display panel, such as a pixel electrode, a TFT, a data line, a gate line, and the like are not shown. The lower substrate 201 in FIG. 2 may be an array substrate, and the upper substrate 208 may be a color filter substrate. The insulating layer 202 may be a gate insulating layer, a passivation layer, a planarization layer, other insulating layers in the panel structure, or any combination thereof. The present disclosure does not limit the specific structure of the display panel, and any display panels which allow the first electrical connection member to be disposed between the common electrode and the black matrix may be used as embodiments of the present disclosure.

Figure 3A:
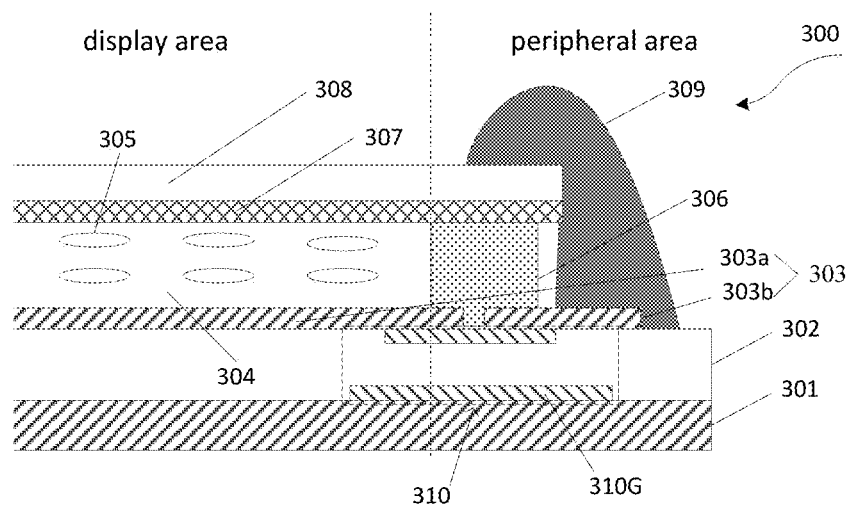
FIG. 3A illustrates a partial structural view of a display panel according to another exemplary embodiment of the present disclosure.

FIG. 3A illustrates a partial structural view of a display panel 300 according to another exemplary embodiment of the present disclosure. As shown in FIG. 3A, the display panel 300 includes: a lower substrate 301, an insulating layer 302 over the lower substrate 301, a common electrode 303 including a first electrode portion 303a and a second electrode portion 303b on the insulating layer 302, a liquid crystal layer 304 on the common electrode, liquid crystal molecules 305 in the liquid crystal layer 304, a sealant 306 around the liquid crystal layer 304, a black matrix 307 above the liquid crystal layer 304, and a upper substrate 308 above the black matrix 307. The display panel 300 further includes a first electrical connection member 309 made of conductive silver paste for electrically connecting the black matrix 307 to the common electrode 303.

The difference from the embodiment shown in FIG. 2 is that, in the display panel 300 of the embodiment shown in FIG. 3A, the common electrode includes the first electrode portion 303a and the second electrode portion 303b separated by the sealant 306. The first electrode portion 303a is located at least in the display area of the display panel 300, and the second electrode portion 303b is located in the peripheral area of the display panel 300. The display panel 300 further includes a switching device 310 for turning on or off the electrical connection between the first electrode portion 303a and the second electrode portion 303b, and the first electrical connection member 309 only electrically connects the black matrix 307 to the second electrode portion 303b.

According to the structure of the display panel described above, the common electrode is divided into the first electrode portion 303a and the second electrode portion 303b which are disconnected from each other, and the first electrode portion 303a and the second electrode portion 303b are selectively connected by the switching device 310. Therefore, the black matrix 307 may be selectively electrically connected to a portion of the common electrode in the display area through the switching device 310, so that the anti-internal-static function may be selectively turned on or off according to the use environment. For example, when the display panel 300 is just beginning to work and the static electricity is less accumulated, the switching device may be turned off to avoid unnecessarily increasing the power consumption of the display panel 300.

Specifically, according to the embodiment shown in FIG. 3A, the switching device 310 is a TFT. One of a source electrode and a drain electrode of the TFT is electrically connected to the first electrode portion 303a, and the other one of the source electrode and the drain electrode of the TFT is electrically connected to the second electrode portion 303b. A gate electrode 310G of the TFT is used for receiving a trigger signal. According to this embodiment, the TFT serves as the switching device, the switching device 310 for connecting the two portions of the common electrode may be fabricated in the process of fabricating the TFT used as the pixel switch in the array substrate, thus, it is easy to manufacture the switching device 310 without adding an extra process.

Figure 3B:
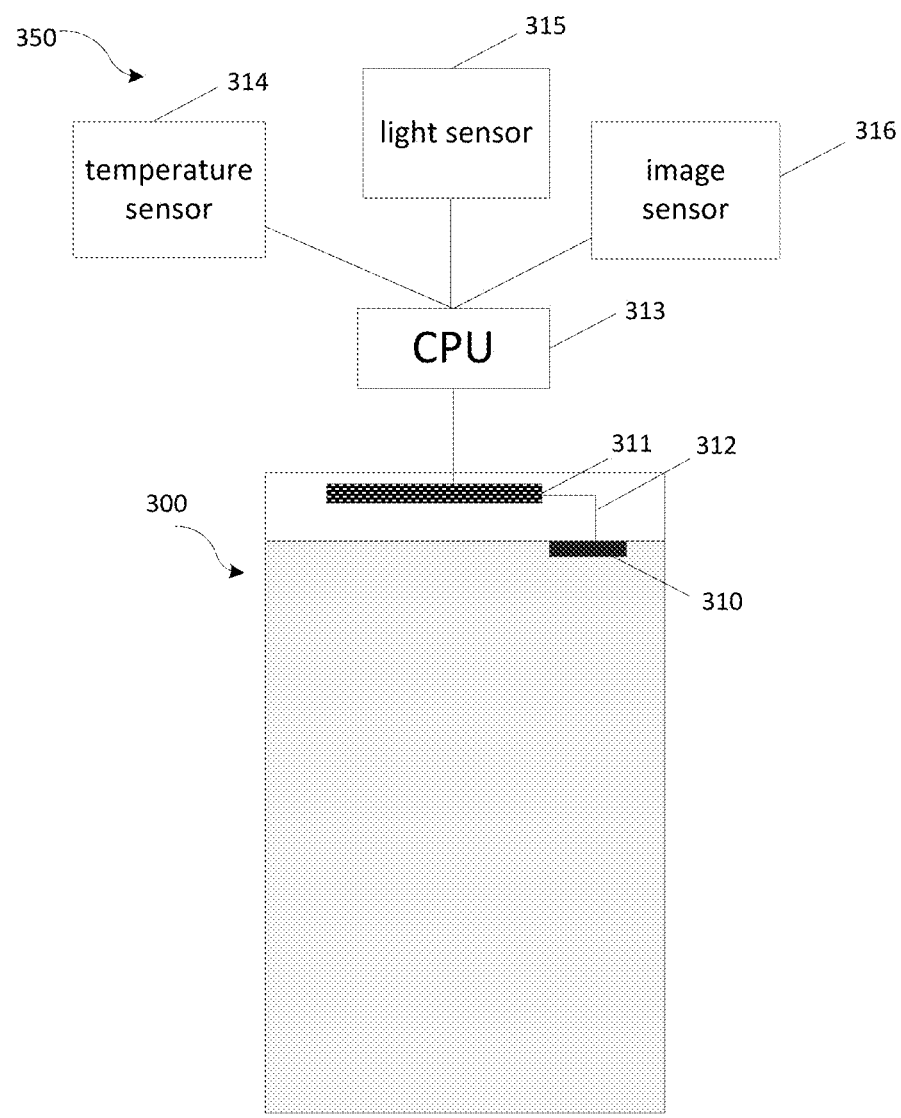
FIG. 3B illustrates a schematic view of a display device including the display panel of FIG. 3A according to an exemplary embodiment of the present disclosure.

FIG. 3B illustrates a schematic view of a display device 350 including the display panel 300 of FIG. 3A, according to an embodiment of the present disclosure. As shown in FIG. 3B, according to an embodiment of the present disclosure, the display device 350 includes a display panel 300, the display panel 300 includes a driving IC 311 and a TFT 310, and the driving IC 311 is connected to the TFT 310 through a leading wire 312. The display device 350 further includes a CPU (Central Processing Unit) 313, and at least one of a temperature sensor 314, a light sensor 315, and an image sensor 316. The temperature sensor 314, the light sensor 315, and the image sensor 316 are connected to the CPU 313 by wires, respectively. The CPU 313 is connected to the driving IC of the display panel by wires.

According to this embodiment, the temperature sensor 314, the light sensor 315 or the image sensor 316 acts as a sensing device and generates a trigger signal to trigger the turning on and off of the TFT. Specifically, the temperature sensor 314 triggers the TFT according to a predetermined temperature condition, for example, when the sensed temperature reaches 50° C., the trigger signal is generated. The light sensor 315 triggers the TFT according to a predetermined illumination condition, for example, when the sensed light intensity reaches 10,000 nit, the trigger signal is generated. The image sensor 316 triggers the TFT according to the state of a displayed image, for example, when the display panel displays the same image for 2 hours, the trigger signal is generated.

The CPU 313 may receive the trigger signal from the temperature sensor 314, the light sensor 315, or the image sensor 316, and send a control signal to the driving IC 311 of the display panel 300 according to the trigger signal, and then the TFT 310 is controlled to be turned on by the driving IC 311. Specifically, the driving IC 311 transmits a high level signal to the gate electrode 310G (shown in FIG. 3A) of the TFT 310, and the TFT 310 is turned on. At this time, as shown in FIG. 3A, the black matrix 307 is electrically connected with the first electrode portion 303a of the common electrode, and ions on the black matrix 307 start to diffuse toward the common electrode. After a period of time, the black matrix 307 has the same potential as the first electrode portion 303a of the common electrode, and a voltage difference therebetween is zero. In this way, the adverse effects that static electricity on the black matrix may act on the display panel are eliminated.

Thereafter, the TFT 310 may be turned off again as needed. For example, after the TFT 310 is turned on for 10 minutes, it is expected that the ions accumulated on the black matrix 307 have been uniformly diffused, and a potential difference between the black matrix 307 and the first electrode portion 303a of the common electrode has been eliminated. At this time, the CPU 313 transmits a control signal to the driving IC 311 of the display panel 300, and the driving IC 311 controls the TFT 310 to be turned off.

Examples of the display device described above may include a device having a display function such as a mobile phone, a tablet computer, a notebook computer, a digital photo frame, a personal digital assistant, a navigator, a television, a desktop and the like, which is not limited in the present disclosure.

Although the above embodiment describes a case where the sensing device is integrated outside the display panel, those skilled in the art may appreciate that, according to other embodiments, the sensing device may also be integrated in the display panel. The sensing device is directly connected to the gate electrode of the TFT without the CPU and the driving IC, and trigger the TFT to be turned on according to a predetermined condition. For example, as an example of a temperature sensor, the sensing device may be a thermistor connected to the gate electrode of the TFT. When a predetermined temperature is reached, the thermistor triggers the TFT to be turned on. Alternatively, as an example of the light sensor, the sensing device may be a photoresistor connected to the gate electrode of the TFT. When a predetermined light intensity is reached, the photoresistor triggers the TFT to be turned on. Alternatively, the sensing device may be an image sensor, and the image sensor is connected to the gate electrode of the TFT. When it is detected that the display panel displays the same image for a predetermined period, the image sensor triggers the TFT to be turned on. The image sensor may detect a continuous display time of the same image, for example, by monitoring an electrical signal applied to a pixel electrode.

Figure 4:
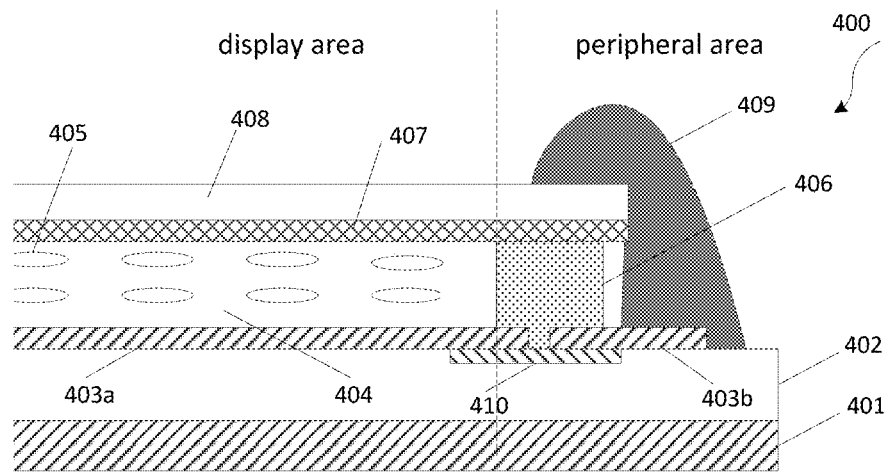
FIG. 4 illustrates a partial structural view of a display panel according to another exemplary embodiment of the present disclosure.

FIG. 4 illustrates a partial structural view of a display panel 400 according to another exemplary embodiment of the present disclosure. As shown in FIG. 4, the display panel 400 includes: a lower substrate 401, an insulating layer 402 over the lower substrate 401, a common electrode including a first electrode portion 403a and a second electrode portion 403b on the insulating layer 402, a liquid crystal layer 404 on the common electrode, liquid crystal molecules 405 in the liquid crystal layer 404, a sealant 406 around the liquid crystal layer 404, a black matrix 407 above the liquid crystal layer 404, and an upper substrate 408 above the black matrix 407. The display panel 400 further includes a first electrical connection member 409 made of conductive silver paste for electrically connecting the black matrix 407 to the second electrode portion 403b of the common electrode.

The difference from the embodiment shown in FIG. 3A is that, in the display panel 400 of the embodiment shown in FIG. 4, the switching device is a thermistor 410, and the thermistor 410 is connected between the first electrode portion 403a and the second electrode portion 403b. The thermistor 410 is a negative temperature coefficient thermistor whose resistance decreases as a temperature increases. For example, when the temperature of the display panel reaches 50° C., the resistance of the thermistor is negligible, and the first electrode portion 403a and the second electrode portion 403b of the common electrode are electrically connected with each other. Thus, electric charges accumulated on the black matrix 407 may be diffused to the first electrode portion of the common electrode through the first electrical connection member 409 and the thermistor 410 serving as the switching device. After a period of time, the black matrix 407 has the same potential as the first electrode portion of the common electrode, and the potential difference therebetween is zero. Therefore, the adverse effects that static electricity on the black matrix may act on the display panel are eliminated. According to this embodiment, since the thermistor may automatically electrically connect the black matrix to the first electrode portion of the common electrode located in the display area while satisfying the predetermined temperature condition, it is not necessary to additionally provide the temperature sensor.

Figure 5:
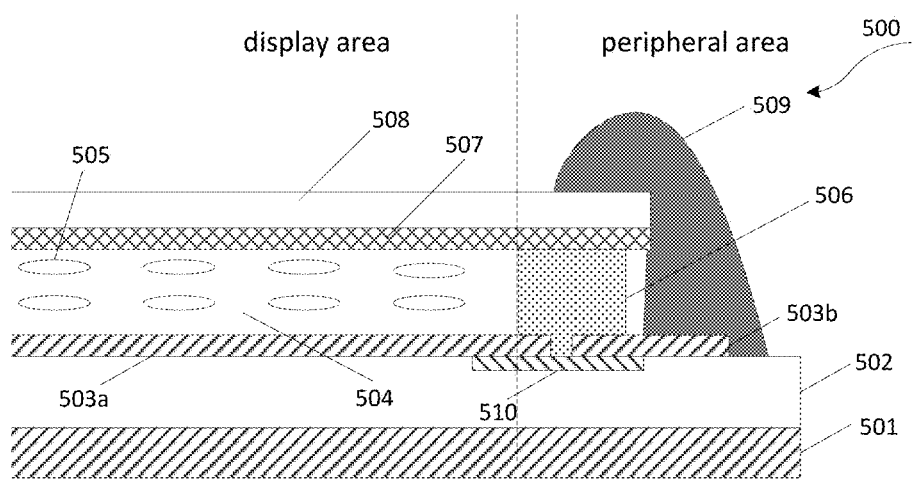
FIG. 5 illustrates a partial structural view of a display panel according to another exemplary embodiment of the present disclosure.

FIG. 5 illustrates a partial structural view of a display panel 500 according to another exemplary embodiment of the present disclosure. As shown in FIG. 5, the display panel 500 includes: a lower substrate 501, an insulating layer 502 over the lower substrate 501, a common electrode including a first electrode portion 503a and a second electrode portion 503b on the insulating layer 502, a liquid crystal layer 504 on the common electrode, liquid crystal molecules 505 in the liquid crystal layer 504, a sealant 506 around the liquid crystal layer 504, a black matrix 507 above the liquid crystal layer 504, and an upper substrate 508 above the black matrix 507. The display panel 500 further includes a first electrical connection member 509 made of conductive silver paste for electrically connecting the black matrix 507 to the second electrode portion 503b of the common electrode.

The difference from the embodiment shown in FIG. 3A is that, in the display panel 500 of the embodiment shown in FIG. 5, the switching device is a photoresistor 510, and the photoresistor 510 is connected between the first electrode portion 503a and the second electrode portion 503b. The resistance of the photoresistor 510 decreases as light intensity increases. In particular, under a strong light, the resistance of the photoresistor becomes small. For example, when the light intensity reaches 10,000 nit, the resistance of the photoresistor is negligible, and the first electrode portion 503a and the second electrode portion 503b of the common electrode are electrically connected with each other. Thus, the electric charges accumulated on the black matrix 507 is diffused toward the first electrode portion of the common electrode through the first electrical connection member 509 and the photoresistor 510 serving as the switching device. After a period of time, the black matrix 507 has the same potential as the first electrode portion of the common electrode, and the potential difference therebetween is zero. Therefore, the adverse effects that static electricity on the black matrix may act on the display panel are eliminated. According to this embodiment, since the photoresistor may automatically electrically connect the black matrix and the first electrode portion of the common electrode located in the display area while satisfying the predetermined illumination condition, it is not necessary to additionally provide the light sensor.

Figure 6A:
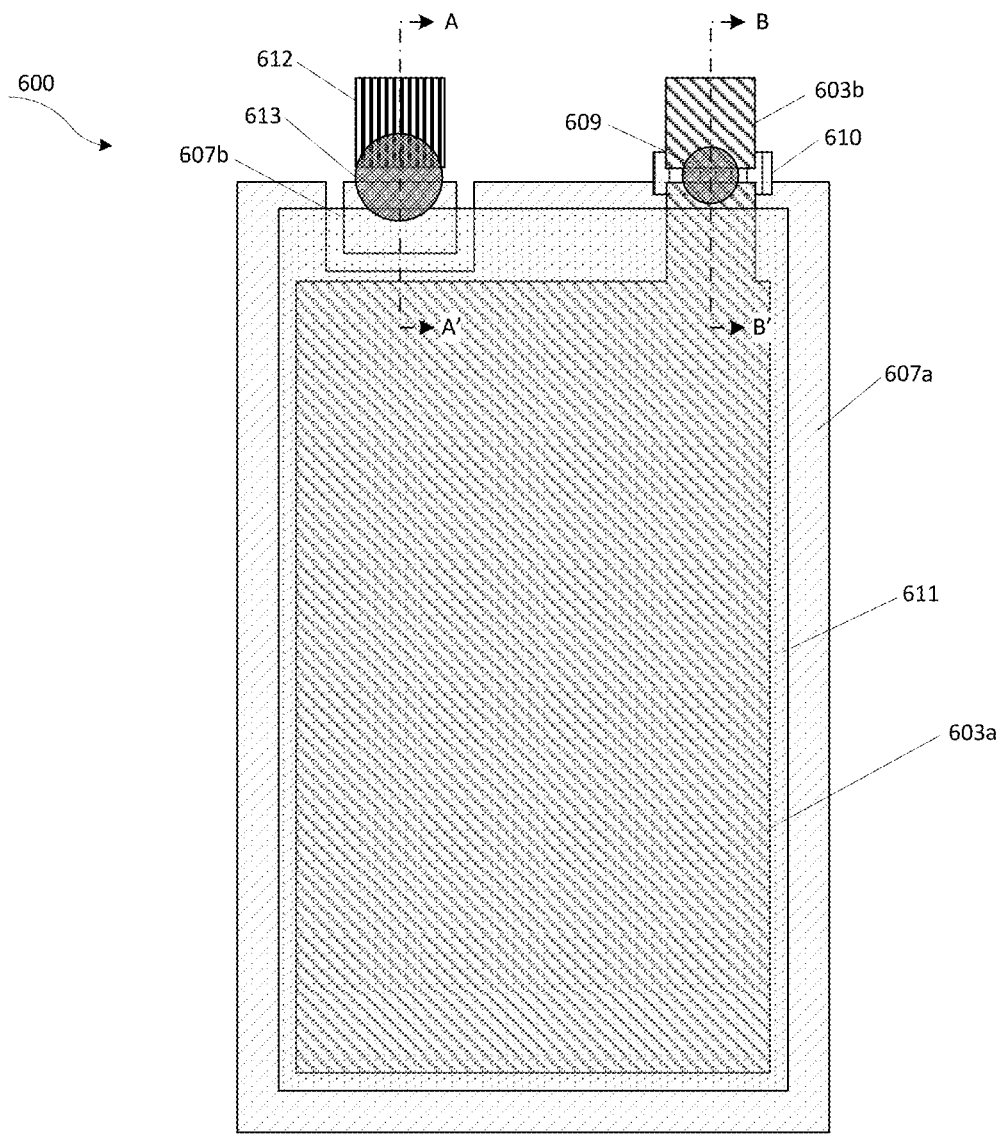
FIG. 6A illustrates a schematic plan view of a display panel according to another exemplary embodiment of the present disclosure.
Figure 6B:
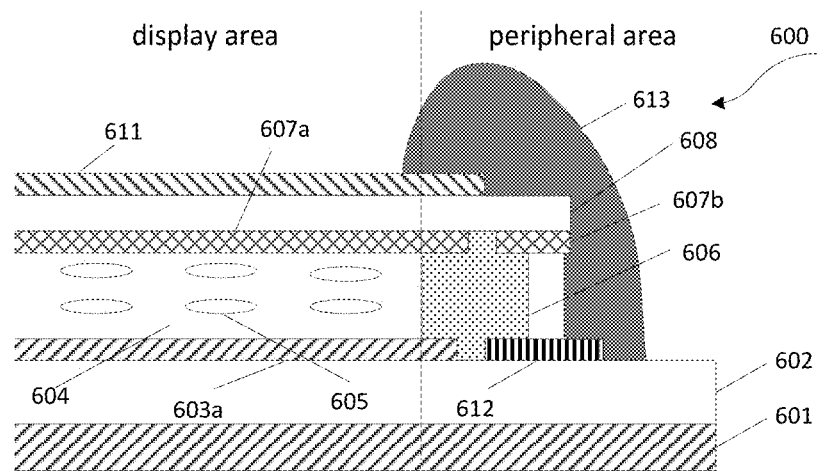
FIG. 6B illustrates a schematic cross-sectional view of the display panel taken along line A-A' in FIG. 6A.
Figure 6C:
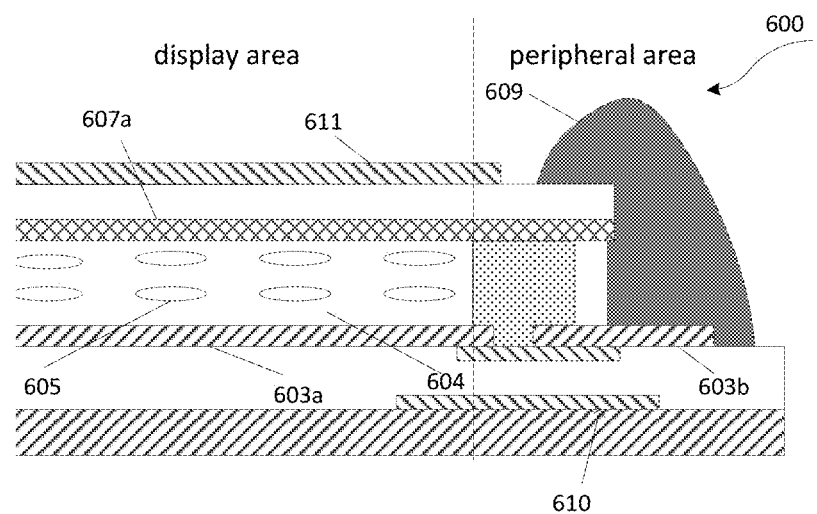
FIG. 6C illustrates a schematic cross-sectional view of the display panel taken along line B-B' in FIG. 6A.

FIG. 6A illustrates a schematic plan view of a display panel 600 according to another exemplary embodiment of the present disclosure. FIG. 6B illustrates a schematic cross-sectional view of the display panel taken along line A-A' in FIG. 6A. FIG. 6C illustrates a schematic cross-sectional view of the display panel taken along line B-B' in FIG. 6A.

As shown in FIGS. 6A-6C, the display panel 600 includes: a lower substrate 601, an insulating layer 602 over the lower substrate 601, a common electrode including a first electrode portion 603a and a second electrode portion 603b on the insulating layer 602, a liquid crystal layer 604 on the common electrode, liquid crystal molecules 605 in the liquid crystal layer 604, a sealant 606 around the liquid crystal layer 604, a black matrix above the liquid crystal layer 604, and an upper substrate 608 above the black matrix.

The difference from the embodiment shown in FIG. 3A is that: the display panel 600 of the embodiment shown in FIGS. 6A-6C includes a second electrical connection member 613 made of conductive silver paste in addition to a first electrical connection member 609 made of conductive silver paste. Referring to FIG. 6B, the display panel 600 further includes a surface conductive layer 611 disposed on the upper substrate 608 and a ground wire 612 disposed on the insulating layer 602 and separated from the upper substrate. The second electrical connection member 613 electrically connects the surface conductive layer 611 to the ground wire 612. According to this embodiment, the second electrical connection member 613 electrically connects the surface conductive layer 611 to the ground wire 612, so that external static electricity accumulated on the surface of the display panel 600 may be discharged, and the adverse effect that external static electricity may act on the display panel 600 may be eliminated. Please note that although the embodiment of FIG. 6B shows that the ground wire 612 is in the same layer as the common electrode, the ground wire and the common electrode may be located in different layers in the display panel; although the surface conductive layer 611 in the embodiment of FIGS. 6B, 6C is disposed on a upper surface of upper substrate 608, the surface conductive layer 611 may also be disposed on a lower surface of the lower substrate 601 in other embodiments, that is, the surface conductive layer may be disposed on at least one outer surface of the display panel.

Meanwhile, in this embodiment, as shown in FIGS. 6A and 6B, the black matrix includes a first black matrix portion 607a and a second black matrix portion 607b separated by the sealant 606. The first black matrix portion 607a is electrically connected to the first electrical connection member 609. The second black matrix portion 607b is electrically connected to the second electrical connection member 613. Since the first black matrix portion 607a and the second black matrix portion 607b are disconnected from each other, the second electrical connection member 613 may be electrically isolated from the first black matrix portion 607a in the display area. In this way, the external static electricity may be prevented from entering the portion of the black matrix in the display area through the second electrical connection member 613. A potential difference due to the external static electricity does not occur between the black matrix and the common electrode, and the display panel is not caused to display abnormally.

Although the first black matrix portion 607a and the second black matrix portion 607b that are disconnected from each other are illustrated in FIG. 6B, those skilled in the art will appreciate that the second black matrix portion 607b may be omitted. Thus, the second electrical connection member 613 may also be electrically isolated from the black matrix in the display area.

Further, in this embodiment, as shown in FIGS. 6A and 6C, the common electrode includes the first electrode portion 603a and the second electrode portion 603b which are disconnected from each other. The first electrode portion 603a is located at least in the display area of the display panel 600. The second electrode portion 603b is located in the peripheral area of the display panel 600. The display panel 600 further includes a switching device 610. The switching device 610 is used for turning on or off the electrical connection between the first electrode portion 603a and the second electrode portion 603b. The first electrical connection member 609 electrically connects the first black matrix portion 607a to the second electrode portion 603b.

Thus, the first black matrix portion 607a is electrically connected to the common electrode through the first electrical connection member 609, and the first black matrix portion 607a in the display area has the same potential as the common electrode. Even if ion accumulation occurs on the black matrix inside the display panel during the operation of the display panel, the static electricity accumulated on the black matrix may not generate an abnormal electric field. Therefore, abnormal display due to abnormal deflections of liquid crystal molecules is not caused.

Further, the first electrode portion 603a and the second electrode portion 603b are connected by the switching device 610. The black matrix may be selectively electrically connected to the first electrode portion 603a through the switching device 610, so that an anti-internal-static function may be selectively turned on or off under the condition that the predetermined use condition is satisfied, so as to avoid unnecessarily increasing the power consumption of the display panel.

In this embodiment, as shown in FIGS. 6A and 6C, the first electrical connection member 609 is electrically isolated from the surface conductive layer 611. In this way, the first black matrix portion 607a may be prevented from being grounded through the first electrical connection member 609 and the surface conductive layer 611, so that a situation in which the normal display of the display panel is affected due to a potential difference generated between the first black matrix portion 607a and the first electrode portion 603a does not occur.

As shown in FIG. 6A, the first electrical connection member 609 and the second electrical connection member 613 are both located in a non-display area (i.e. a peripheral area) of the display panel. In one aspect, the first electrical connection member 609 connects the second electrode portion 603b to the first black matrix portion 607a, and the switching device 610 is connected between the first electrode portion 603a and the second electrode portion 603b. In this case, when the switching device 610 is turned on, the first electrical connection member 609 electrically connects the first black matrix portion 607a to the first electrode portion 603a, so that the first black matrix portion 607a and the first electrode portion 603a both located in the display area have the same potential, and no electric field is generated between the first black matrix portion 607a and the first electrode portion 603a, thereby preventing internal static electricity accumulated on the black matrix from adversely affecting the display panel. On the other aspect, the second electrical connection member 613 connects the ground wire 612 to the surface conductive layer 611 to lead the static electricity accumulated on the surface of the display panel to the ground, thereby eliminating the adverse effect that external static electricity may act on the display panel. Therefore, according to the display panel of the embodiment, it is possible to simultaneously eliminate the adverse effects that both the internal static electricity and the external static electricity may act on the display panel, and ensure that the display panel may work normally.

Please note that although only one first silver paste dot (first electrical connection member) 609 and one second silver paste dot (second electrical connection member) 613 are shown in FIG. 6A, those skilled in the art may understand that a plurality of first silver paste dot and/or a plurality of second silver paste dots may be disposed in the peripheral area of the display panel as needed. In addition, although both the black matrix and common electrode are integrally planar as shown in the figures, those skilled in the art will appreciate that at least one of the black matrix and the common electrode may be in a grid shape.

In addition, although FIGS. 6A-6C employ the structure of the silver paste dot and the switching device as shown in FIG. 3A, the display panel of FIGS. 6A-6C may also adopt the structure as shown in FIG. 2, that is, an integral common electrode is employed, and no switching device is required.

Although various embodiments of the present disclosure have been described above with reference to the drawings, those skilled in the art will appreciate that different embodiments may be combined or partially substituted under a condition without causing a conflict. For example, although FIGS. 3A to 5 respectively illustrate examples in which a TFT, a photoresistor, and a thermistor are employed as the switching device, the present disclosure is not limited thereto, and the TFT, the photoresistor, and the thermistor may be simultaneously employed in the same display panel, so that the black matrix is selectively electrically connected to the common electrode according to different work conditions.

An embodiment of another aspect of the present disclosure provides a display device including the display panel of anyone of the above embodiments. Examples of the display device may include a device having a display function such as a mobile phone, a tablet computer, a notebook computer, a digital photo frame, a personal digital assistant, a navigator, a television, a desktop computer and the like, which is not limited in the present disclosure.

According to the display device of the present disclosure, it is possible to effectively eliminate the adverse effect of external and/or internal static electricity on the display panel, and to ensure normal display of the display device.

An embodiment of another aspect of the present disclosure provides a method of manufacturing the display panel according to the above embodiments. The method includes: forming an electrical connection between a black matrix and a common electrode.

Optionally, the manufacturing method of the present disclosure may further include: providing a switching device configured to turn on or off the electrical connection between the black matrix and the common electrode.

Optionally, the common electrode includes a first electrode portion and a second electrode portion that are disconnected from each other, the first electrode portion is located in a display area of the display panel, and the second electrode portion is located in a peripheral area of the display panel. A first electrical connection member electrically connect the black matrix to the second electrode portion, and the switching device is configured to turn on or off an electrical connection between the first electrode portion and the second electrode portion.

The switching device may be a TFT. The manufacturing method of the present disclosure may further include: fabricating the TFT that turns on or off the electrical connection between the black matrix and the common electrode in the same fabrication process of forming a TFT serving as a pixel switch. Thus, it is not necessary to additionally add processes, and the process is simplified.

Alternatively, the switching device may be a thermistor or a photoresistor.

Optionally, the display panel further includes a surface conductive layer and a ground wire disposed apart from the surface conductive layer in a thickness direction of the display panel. The manufacturing method of the present disclosure may further include: forming an electrical connection between the surface conductive layer and the ground wire.

According to the method of manufacturing a display panel according to the above-described embodiments of the present disclosure, it is possible to effectively eliminate an adverse effect of external and/or internal static electricity on the display panel, and to ensure normal display of the display device.

The embodiments of the present disclosure have been described above by examples, and those skilled in the art will recognize that various modifications and changes may be made to the embodiments of the present disclosure without departing from the scope of the disclosure. All such modifications and variations are intended to fall within the scope of the present disclosure. Therefore, the scope of protection of the present disclosure should be subject to the scope of protection defined by the claims.

What is claimed is:

1. A display panel comprising:
   a first electrostatic discharge layer comprising a first electrode portion and a second electrode portion disconnected from each other, the first electrode portion being located at least in a display area of the display panel, and the second electrode portion being located in a peripheral area of the display panel;
   a second electrostatic discharge layer separated from the first electrostatic discharge layer in a thickness direction of the display panel;
   a first electrical connection member configured to electrically connect the second electrostatic discharge layer with the second electrode portion of the first electrostatic discharge layer; and
   a switching device configured to turn on or off an electrical connection between the first electrode portion and the second electrode portion.

2. The display panel according to claim 1, wherein the switching device is a TFT, and one of a source electrode and a drain electrode of the TFT is electrically connected to the first electrode portion, the other one of the source electrode and the drain electrode of the TFT is electrically connected to the second electrode portion, and a gate electrode of the TFT is used for receiving a trigger signal.

3. The display panel according to claim 1, wherein the display panel further comprises a first substrate and a second substrate opposite to each other, the first electrostatic discharge layer is disposed on a side of the first substrate facing the second substrate, and the second electrostatic discharge layer is disposed on a side of the second substrate facing the first substrate.

4. The display panel according to claim 1, wherein the switching device is a thermistor, the thermistor is connected between the first electrode portion and the second electrode portion, and a resistance of the thermistor decreases with increasing temperature.

5. The display panel according to claim 1, wherein the first electrostatic discharge layer comprises a common electrode and the second static electrostatic discharge layer comprises a black matrix.

6. The display panel according to claim 1, wherein the switching device is a photoresistor, the photoresistor is connected between the first electrode portion and the second electrode portion, and a resistance of the photoresistor decreases with increasing light intensity.

7. The display panel according to claim 1, wherein material of the first electrical connection member comprises conductive silver paste.

8. The display panel according to claim 1, further comprising:
   a surface conductive layer covering at least one outer surface of the display panel;
   a ground wire, separated from the surface conductive layer in the thickness direction of the display panel; and
   a second electrical connection member configured to electrically connect the surface conductive layer to the ground wire.

9. The display panel according to claim 8, wherein the display panel further comprises a first substrate and a second substrate opposite to each other, the ground wire is disposed on a side of the first substrate facing the second substrate, and the surface conductive layer is disposed on a side of the second substrate away from the first substrate.

10. The display panel according to claim 8, wherein the second electrical connection member is electrically isolated from the second electrostatic discharge layer, and the first electrical connection member is electrically isolated from the surface conductive layer.

11. The display panel according to claim 1, wherein the display panel further comprises a liquid crystal layer, the liquid crystal layer being located between the first electrostatic discharge layer and the second electrostatic discharge layer.

12. The display panel according to claim 8, wherein the first electrical connection member and/or the second electrical connection member are formed in the peripheral area of the display panel.

13. A display device comprising the display panel according to claim 1.

14. The display panel according to claim 8, wherein the second electrostatic discharge layer comprises a first portion at least in the display area of the display panel and a second portion in the peripheral area of the display panel, the first portion is electrically isolated from the second portion, and the second electrical connection member is electrically connected to the second portion.

15. The display panel according to claim 8, wherein the first electrostatic discharge layer comprises a common electrode, and the ground wire and the common electrode are disposed in the same layer.

16. The display panel according to claim 8, wherein the number of at least one of the first electrical connection member and the second electrical connection member is one or more.

* * * * *